United States Patent
Yang (10) Patent No.: US 11,442,170 B2
(45) Date of Patent: Sep. 13, 2022

(54) IMAGING SYSTEM, PIXEL ARRAY OF IMAGING SYSTEM AND IMAGE SENSOR

(71) Applicant: SHENZHEN GOODIX TECHNOLOGY CO., LTD., Guangdong (CN)

(72) Inventor: Meng-Ta Yang, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/033,767

(22) Filed: Sep. 26, 2020

(65) Prior Publication Data

US 2021/0011169 A1    Jan. 14, 2021

Related U.S. Application Data

(63) Continuation of application No. PCT/CN2019/076295, filed on Feb. 27, 2019.

(51) Int. Cl.
*G01S 17/894* (2020.01)
*H04N 5/378* (2011.01)
(Continued)

(52) U.S. Cl.
CPC .......... *G01S 17/894* (2020.01); *G01T 1/2971* (2013.01); *H04N 5/378* (2013.01);
(Continued)

(58) Field of Classification Search
None
See application file for complete search history.

(56) References Cited

U.S. PATENT DOCUMENTS 9,781,318 B2 * 10/2017 You ................... G01B 11/2513
2009/0303371 A1 * 12/2009 Watanabe ......... H01L 27/14641
348/311
(Continued)

FOREIGN PATENT DOCUMENTS

CN    102157529 A    8/2011
CN    103561218 A    2/2014
(Continued)

OTHER PUBLICATIONS

English Abstract Translation of CN102157529A.
(Continued)

*Primary Examiner* — Edwin C Gunberg
(74) *Attorney, Agent, or Firm* — WPAT, P.C., Intellectual Property Attorneys; Anthony King (57) ABSTRACT

An image sensor including a pixel array which includes pixels for sensing a reflected signal, incident on the pixel array to form reflected light spots separated from each other. Each pixel includes a photodetector and a readout circuit. The photodetector is configured to detect the reflected signal and output a photo response signal. The readout circuit is configured to generate a pixel output according to the photo response signal. The pixels include a first pixel and a second pixel adjacent to the first pixel along a first predetermined direction. The readout circuit of the first pixel is adjacent to the photodetector of the second pixel along the first predetermined direction, and adjacent to the photodetector of the first pixel along a second predetermined direction perpendicular to the first predetermined direction. The pixel array has a small pixel pitch and a high fill factor.

16 Claims, 10 Drawing Sheets

(51) Int. Cl.
  *G01T 1/29* (2006.01)
  *G01T 1/20* (2006.01)
  *H04N 5/32* (2006.01)
  *H04N 3/14* (2006.01)

(52) U.S. Cl.
  CPC .......... *G01T 1/2018* (2013.01); *G01T 1/2928* (2013.01); *H04N 3/155* (2013.01); *H04N 5/32* (2013.01)

(56) References Cited

U.S. PATENT DOCUMENTS

| | | | |
|---|---|---|---|
| 2013/0088621 A1 | 4/2013 | Hamada | |
| 2013/0250274 A1 | 9/2013 | Kurokawa | |
| 2014/0145068 A1* | 5/2014 | Meynants | H01L 27/14643 250/208.1 |
| 2014/0205066 A1 | 7/2014 | Kitagawa et al. | |
| 2014/0253905 A1 | 9/2014 | Kim et al. | |
| 2015/0285625 A1 | 10/2015 | Deane | |
| 2018/0219035 A1 | 8/2018 | Otsuki | |

FOREIGN PATENT DOCUMENTS

| | | |
|---|---|---|
| CN | 104800054 A | 7/2015 |
| CN | 106576146 A | 4/2017 |
| CN | 106897688 A | 6/2017 |
| CN | 107210314 A | 9/2017 |
| CN | 108370424 A | 8/2018 |
| CN | 208548353 U | 2/2019 |
| JP | 2017229001 A | 12/2017 |
| WO | 2020057125 A1 | 3/2020 |
| WO | 2020172812 A1 | 9/2020 |

OTHER PUBLICATIONS

English Abstract Translation of CN103561218A.
English Abstract Translation of CN104800054A.
English Abstract Translation of CN106897688A.
English Abstract Translation of CN208548353U.
English Abstract Translation of Foreign Reference CN106576146A.
English Abstract Translation of Foreign Reference CN107210314A.
English Abstract Translation of Foreign Reference CN108370424A.
English Abstract Translation of Foreign Reference JP2017229001A.
English Abstract Translation of Foreign Reference WO2020057125A1.
International Searching Authority (ISA) Form 210—International Search Report of PCT/CN2019/076295.
International Searching Authority (ISA) Form 220—Notification of Transmittal of the International Search Report of PCT/CN2019/076295.
International Searching Authority (ISA) Form 237—Written Opinion of PCT/CN2019/076295.
As-filed PCT Request of PCT/CN2019/076295.
As-filed PCT Application of PCT/CN2019/076295.
Notification of Receipt of Search Chinese (Form PCT/ISA/202) of PCT/CN2019/076295.
Notification of Publication (Form PCT/IB/311) of PCT/CN2019/076295 noting that it has published as WO 2020/172812.

* cited by examiner

IMAGING SYSTEM, PIXEL ARRAY OF IMAGING SYSTEM AND IMAGE SENSOR

CROSS REFERENCE TO RELATED APPLICATIONS

The present application is a continuation of international application No. PCT/CN2019/076295, filed on Feb. 27, 2019, which is hereby incorporated by reference in its entirety.

TECHNICAL FIELD

The present disclosure relates to imaging techniques and, more particularly, to a pixel array applicable to time-of-flight (ToF) imaging techniques, and a related image sensor and imaging system.

BACKGROUND

By continuously sending an optical signal toward an target object from a transmitter, and receiving the optical signal returning from the target object at a receiver, a time-of-flight (ToF) distance measuring technique calculates time of flight of the optical signal traveling from the transmitter side to the receiver side, thereby obtaining a distance between the target object and the transmitter/receiver side. In order to increase resolution and collect depth information of a distant target object, the ToF distance measuring technique utilizes a planar light source with uniform illumination as an illumination source, such that each pixel in a pixel array can receive a light signal reflected from the distant target object. However, extremely high radiated power of the planar light source with uniform illumination not only increases system power consumption, but also causes damages to human eyes in face recognition applications.

Thus, there is a need for a novel ToF imaging scheme, which can provide high resolution images and meet low power consumption requirements.

SUMMARY

It is an objective of the present disclosure to provide a pixel array applicable to ToF imaging techniques, and a related image sensor and imaging system to solve the above-mentioned problems.

Some embodiments of the present disclosure provide an exemplary pixel array of an imaging system. The pixel array comprises a plurality of pixels arranged in rows and columns. The pixels are configured to sense a reflected signal, which is incident on the pixel array to form a plurality of reflected light spots separated from each other on the pixel array. Each of the pixels comprises a photodetector and a readout circuit. The photodetector is configured to detect the reflected signal and accordingly output a photo response signal. The readout circuit, coupled to the photodetector, is configured to generate a pixel output according to the photo response signal. The pixels comprise a first pixel and a second pixel adjacent to the first pixel along a first predetermined direction. The readout circuit of the first pixel is adjacent to the photodetector of the second pixel along the first predetermined direction, and is adjacent to the photodetector of the first pixel along a second predetermined direction perpendicular to the first predetermined direction.

Some embodiments of the present disclosure provide an exemplary image sensor of an imaging system. The image sensor comprises a pixel array and a processing circuit. The pixel array is configured to sense a reflected signal, which is incident on the pixel array to form a plurality of reflected light spots separated from each other on the pixel array. The reflected signal is reflected from a target object in response to a structured light signal sent from the imaging system and reflected by the target object. The pixel array comprises a plurality of pixels arranged in rows and columns. Each of the pixels comprises a photodetector and a readout circuit. The photodetector is configured to detect the reflected signal and accordingly output a photo response signal. The readout circuit, coupled to the photodetector, is configured to generate a pixel output according to the photo response signal. The pixels comprise a first pixel and a second pixel adjacent to the first pixel along a first predetermined direction. The readout circuit of the first pixel is adjacent to the photodetector of the second pixel along the first predetermined direction, and is adjacent to the photodetector of the first pixel along a second predetermined direction perpendicular to the first predetermined direction. The processing circuit, coupled to the pixel array, is configured to detect time of flight of the structured light signal according to a sensing result of the pixel array, and obtain depth information about the target object according to the time of flight.

Some embodiments of the present disclosure provide an exemplary imaging system. The imaging system comprises a light emitting unit and a pixel array. The light emitting unit is configured to send a structured light signal. The pixel array is configured to sense a reflected signal, which is reflected from a target object in response to the structured light signal reflected by the target object. The pixel array comprises a plurality of pixels arranged in rows and columns. The reflected signal is incident on the pixel array to form a plurality of reflected light spots separated from each other on the pixel array. Each of the pixels comprises a photodetector and a readout circuit. The photodetector is configured to detect the reflected signal and accordingly output a photo response signal. The readout circuit, coupled to the photodetector, is configured to generate a pixel output according to the photo response signal. The pixels comprise a first pixel and a second pixel adjacent to the first pixel along a first predetermined direction. The readout circuit of the first pixel is adjacent to the photodetector of the second pixel along the first predetermined direction, and is adjacent to the photodetector of the first pixel along a second predetermined direction perpendicular to the first predetermined direction.

DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to". Also, the term "couple" and "coupled" are intended to mean either an indirect or direct electrical connection. Accordingly, if a first device is coupled to a second device, that connection may be through a direct electrical connection, or through an indirect electrical connection via other devices and connections.

Figure 1:
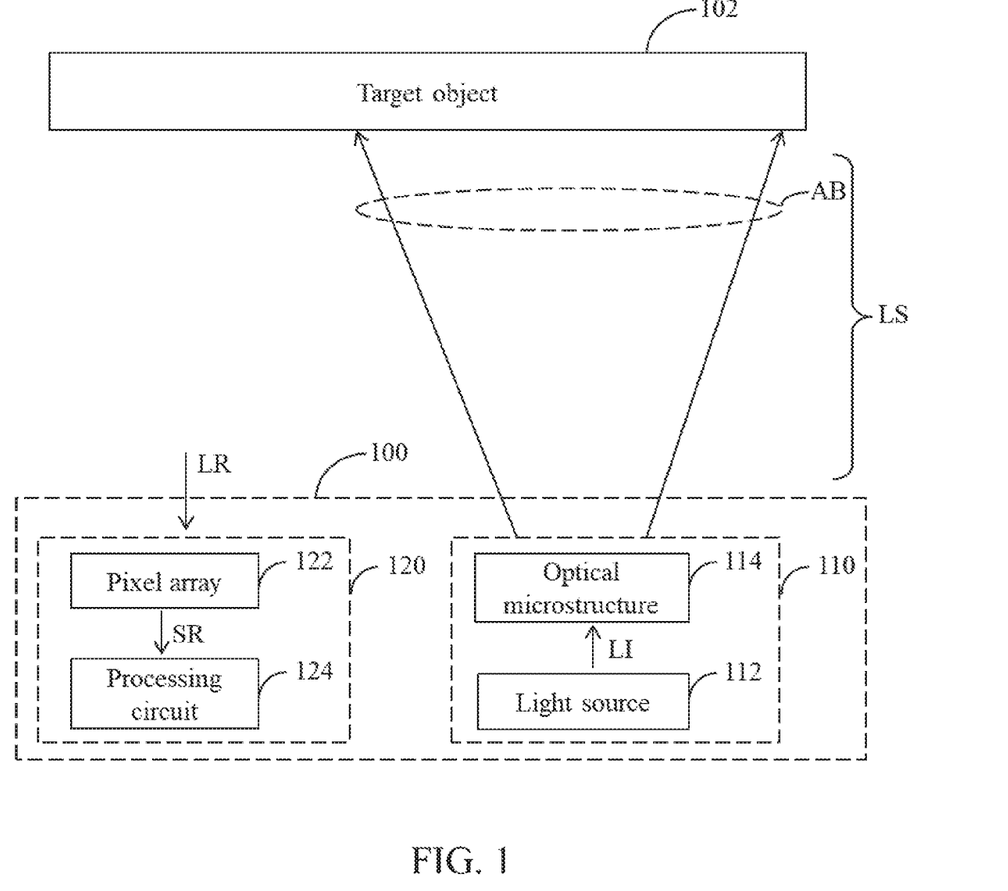
FIG. 1 is a block diagram illustrating an exemplary imaging system in accordance with an embodiment of the present disclosure.

FIG. 1 is a block diagram illustrating an exemplary imaging system in accordance with an embodiment of the present disclosure. The imaging system 100 may be implemented using a three-dimensional (3D) imaging system, and configured to obtain depth information/image of a target object in the surroundings. By way of example but not limitation, the imaging system 100 may be a time-of-flight (ToF) imaging system, which can obtain depth information of a target object 102 by measuring a distance between the target object 102 and the imaging system 100. It is worth noting that, in some embodiments, the imaging system 100 may be a structured light 3D imaging system, which may determine the depth information of the target object 102 according to distortion of a projected structured-light pattern received at a receiver side. For the sake of brevity, the proposed imaging scheme is described below with reference to some embodiments where imaging system 100 is implemented as a ToF imaging system. However, those skilled in the art will recognize that the proposed imaging scheme can be applied to other 3D imaging systems which obtain depth images according to an optical signal sent from a transmitter side and received by a receiver side.

The imaging system 100 may include, but is not limited to, a light emitting unit 110 and an image sensor 120. The light emitting unit 110 is configured to generate a structured light signal LS, wherein the structured light signal LS has a predetermined pattern such that energy of the structured light signal LS may be concentrated in the predetermined pattern. The light emitting unit 110 may include a light source 110 and an optical microstructure 114. The optical microstructure 114 can be arranged to change a travel path of an optical signal LI outputted from the light source 112, thereby generating the structured light signal LS having the predetermined pattern. In the present embodiment, projection of the structured light signal LS onto a cross section plane AB may form a plurality of light spots separated from each other. As a result, energy of the optical light LI can be concentrated in each light spot formed by the structured light signal LS, thereby increasing intensity of light incident on the target object 102 and reducing effects of background noise.

By way of example but not limitation, the optical microstructure 114 may include a diffractive optical element (DOE) or a refractive optical element (ROE), and is configured to conically diffract or refract the optical signal LI to generate the structured light signal LS. Accordingly, the projection of the structured light signal LS onto the cross section plane AB may form a plurality of light spots separated from each other.

The image sensor 120 is configured to sense the reflected signal LR reflected from the target object 102 to thereby obtain image information of the target object 102. The reflected signal LR is generated in response to the structured light signal LR reflected by the target object 102. In the present embodiment, the image sensor 120 includes, but is not limited to, a pixel array 122 and a processing circuit 124. The pixel array 122 is configured to sense the reflected signal LR to generate a sensing result SR. It is worth noting that as the structured light signal LS can from a plurality of light spots on a surface of the target object 102, the reflected signal LR incident on the pixel array 122 may form a plurality of reflected light spots separated from each other on the pixel array 122. The pixel array 122 includes a plurality of pixels, and each reflected light spot may illuminate at least one pixel. In other words, energy of the reflected signal LR can be concentrated and provided to pixels illuminated by the reflected light spots. As a result, a percentage of a background noise component in a light signal, received by a pixel illuminated by a reflected light spot, may decrease to thereby enhance signal quality of a pixel output of the pixel (e.g. a portion of the sensing result SR).

The processing circuit 124, coupled to the pixel array 122, is configured to detect time of flight of the structured light signal LS according to the sensing result SR of the pixel array 122, and obtain the depth information of the target object 102 according to the time of flight. For example, the processing circuit 124 may refer to pixel output(s) generated from pixel(s) illuminated by the reflected light spots to obtain depth information (or a depth image) of an area illuminated by a plurality of light spots, which are formed on the surface of the target object 102 in response to the structured light signal LS.

It is worth noting that, in the present embodiment, a distance between the light emitting unit 110 and each pixel in the pixel array 122 is much shorter than a distance between the light emitting unit 110 and the target object 102, and is much shorter than a distance between each pixel and the target object 102. As a result, regarding a pixel, time of flight of the structured light signal LS traveling from the light emitting unit 110 to the target object 102 may be regarded as equal to time of flight of the reflected signal LR traveling from the target object 102 to the pixel. The processing circuit 124 may therefore measure a distance between the target object 102 and the pixel according to the time of flight and a velocity of the structured light signal LS.

In some embodiments, as a pixel output generated from a pixel illuminated by the reflected light spots has good signal quality, the processing circuit 124 may determine depth information about an area of the surface of the target object 102, which is not illuminated by light spots of the structured light signal LS, according to depth information associated with pixels illuminated by the reflected light spots. The processing circuit 124 may therefore construct a depth image of the target object 102. By way of example but not limitation, the processing circuit 124 may generate refer to a pixel output of a pixel illuminated by the reflected light spots to perform related signal processing, such as interpolation, to thereby generate a pixel output of a pixel which is not illuminated by the reflected light spots.

Additionally, in some embodiments, the pixel array 122 may utilize a small pixel pitch such that a reflected light spot can illuminate a sufficiently large area, such as at least one pixel, and enhance resolution. As a result, the imaging system 100 may not only reduce system power consumption by concentrating energy provided by a transmitter side, but also have good signal detection quality and high resolution.

Figure 2:
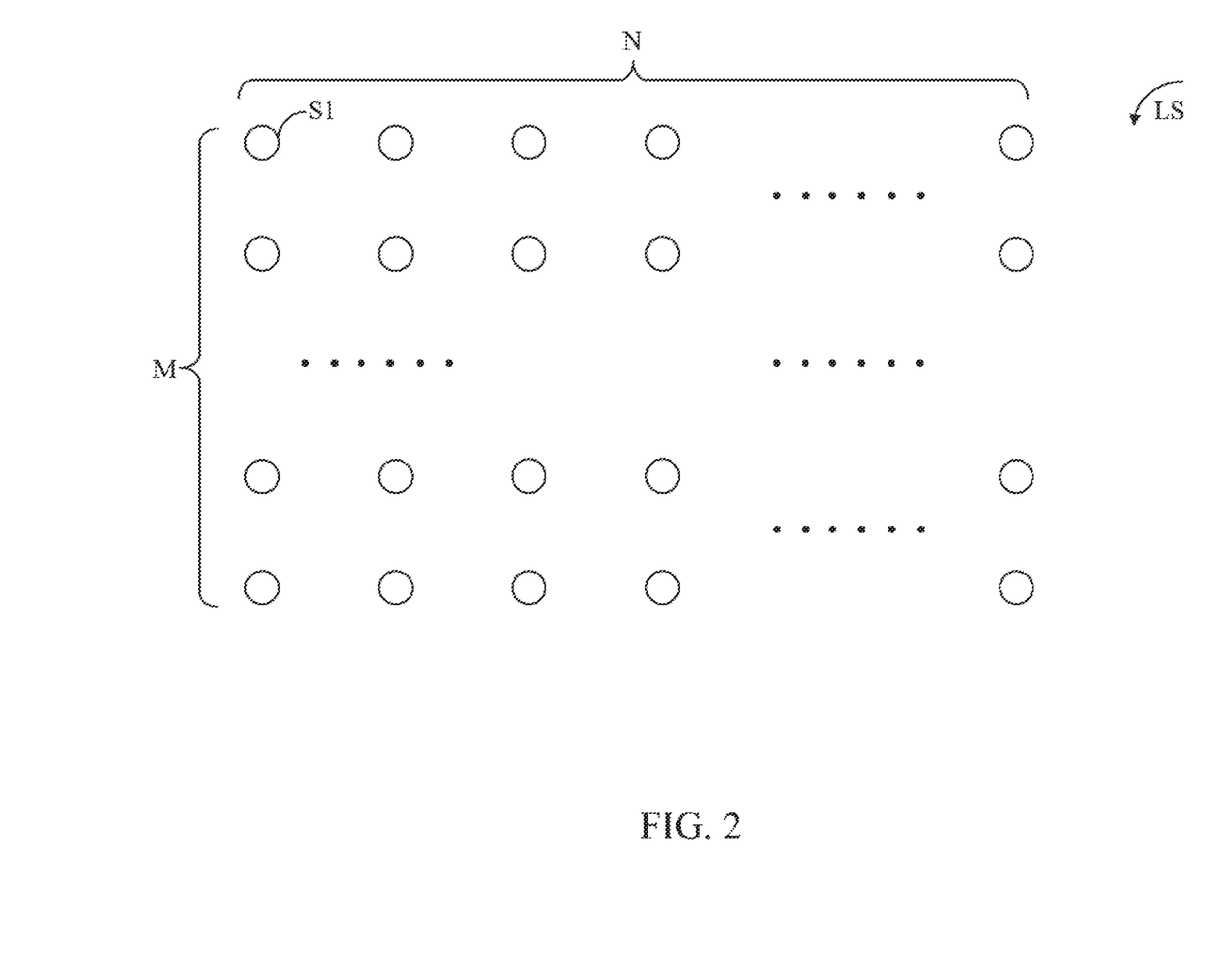
FIG. 2 is diagram illustrating a plurality of light spots formed by projection of the structured light signal onto the cross section plane shown in FIG. 1 in accordance with an embodiment of the present disclosure.
Figure 3:
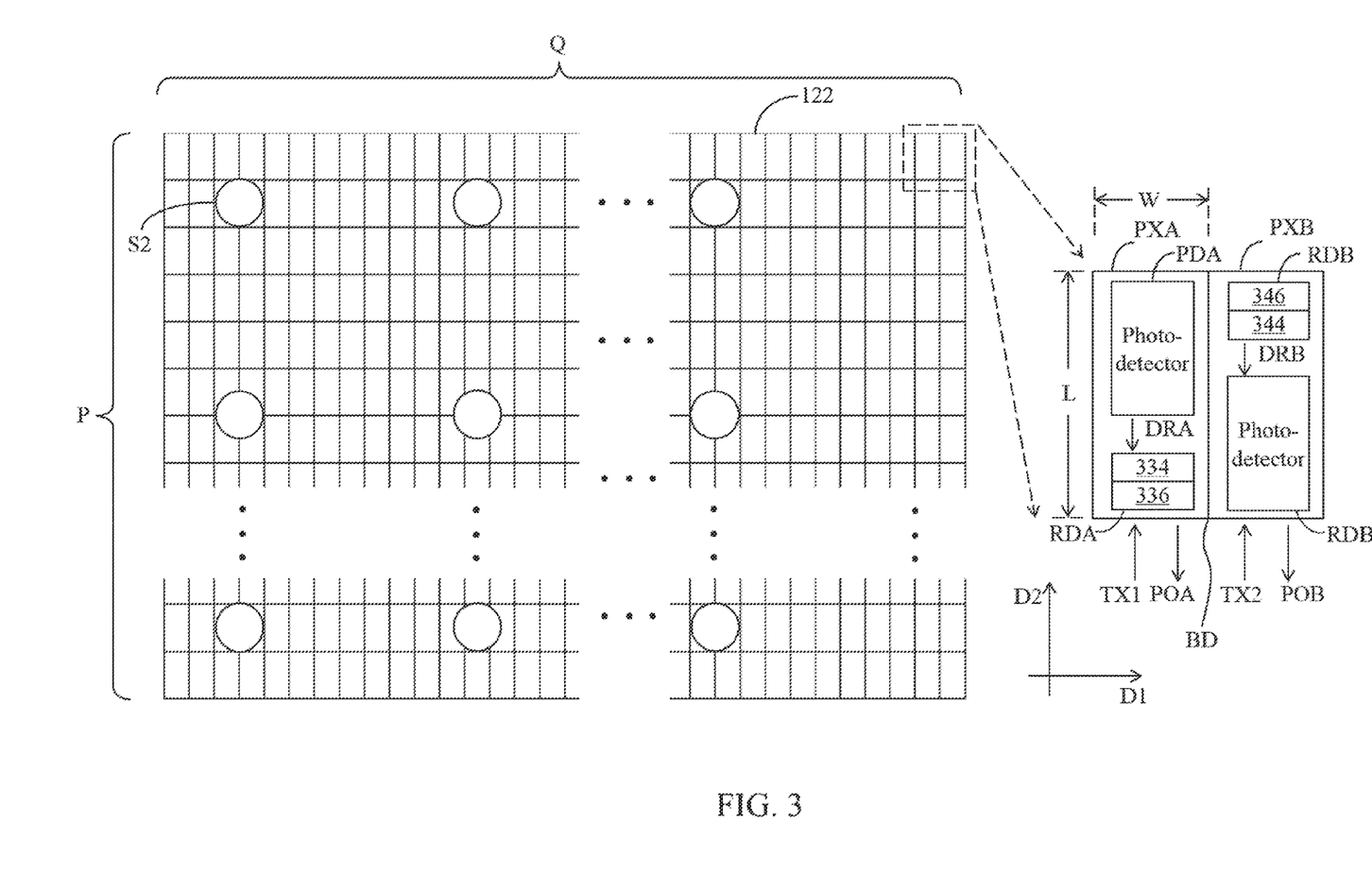
FIG. 3 is a diagram illustrating a plurality of reflected light spots formed by the reflected signal incident on the pixel array shown in FIG. 1 in accordance with an embodiment of the present disclosure.

To facilitate an understanding of the proposed imaging scheme, FIG. 2 and FIG. 3 illustrate distributions of light spots associated with the structured light signal LS and the reflected signal LR shown in FIG. 1, respectively, in accordance with some embodiments of the present disclosure. Light spots shown in FIG. 2 and FIG. 3 are arranged in an array pattern having rows and columns. However, this is provided for illustrative purposes, and is not intended to limit the scope of the present disclosure. In some embodiments, the structured light signal LS shown in FIG. 1 can be implemented by a structured light signal having a different distribution of light spots, e.g. light spots arranged in a polygon pattern and separated from each other, without departing from the scope of the present disclosure. In some embodiments, the reflected signal LR shown in FIG. 1 can be implemented by a reflected signal having a different distribution of light spots, e.g. light spots arranged in a polygon pattern and separated from each other, without departing from the scope of the present disclosure.

Referring firstly to FIG. 1 and FIG. 2, a plurality of light spots formed by projection of the structured light signal LS onto the cross section plane AB shown in FIG. 1 is illustrated in FIG. 2 in accordance with an embodiment of the present disclosure. In the present embodiment, the optical microstructure 114 may be arranged to conically diffract the optical signal LI to generate the structured light signal LS, such that the projection of the structured light signal LS onto the cross section plane AB forms a plurality of light spots S1 arranged in M rows and N columns. Each of M and N is a positive integer greater than one. In other words, the energy of the light signal LI, or the energy of the structured light signal LS, can be concentrated in the light spots S.

It is worth noting that a distance between two adjacent light spots shown in FIG. 2 is provided for illustrative purposes, and is not meant to be a limitation of the present disclosure. In some embodiments, a distance between two adjacent light spots in a row direction and/or a distance between two adjacent light spots in a column direction can be adjusted by changing design of the optical microstructure 114.

Referring to FIG. 1 and FIG. 3, a plurality of reflected light spots formed by the reflected signal LR incident on the pixel array 122 shown in FIG. 1 is illustrated in FIG. 3 in accordance with an embodiment of the present disclosure. In the present embodiment, the reflected signal LR can be reflected from the target object 102 in response to the structured light signal LS shown in FIG. 2 reflected by the target object 102. Also, the reflected signal LR is incident on the pixel array 122 to form a plurality of reflected light spots S2 separated from each other on the pixel array 122. The pixel array 122 may include a plurality of pixels arranged in P rows and Q columns, where P is a positive integer greater than one and less than M, and Q is a positive integer greater than one and less than N. By way of example but not limitation, at least one pixel can be disposed between two adjacent reflected light spots of the reflected light spots S2. As another example, the pixel array 122 may have, but is not limited to, millions of pixels such as 1280×960 pixels. The light emitting unit 110 may use the structured light signal LS having 320×240 light sports, such that the reflected signal LR may form 320×240 reflected light sports on the pixel array 122.

In order to have each reflected light spot illuminate a sufficient large area on the pixel array 122, the pixel array 122 may use a smaller pixel pitch. In addition, a pixel array employed in the proposed imaging scheme may use an asymmetrical pixel array to meet requirements for small pixel pitches and high fill factors, and ensure that each reflected light spot can illuminate a photosensitive region of at least one pixel. A fill factor is a ratio of a photosensitive area to a total area of a pixel.

For example, each pixel of the pixel array 122 may include a photodetector and a readout circuit. With the use of an asymmetrical pixel arrangement, the readout circuit of each pixel may be immediately adjacent to a photosensitive area of the pixel (e.g. the photodetector) in a row direction as well as in a column direction. Accordingly, each pixel may have a high fill factor. Consider an example where the pixels PXA and PXB are adjacent along a first predetermined direction D1 such as a column direction. The pixel PXA includes a photodetector PDA and a readout circuit RDA. The pixel PXB includes a photodetector PDB and a readout circuit RDB. The photodetector PDA is configured to detect the reflected signal LR and accordingly output a photo response signal DRA. The photodetector PDB is configured to detect the reflected signal LR and accordingly output a photo response signal DRB. In addition, the readout circuit RDA, coupled to the photodetector PDA, is configured to generate a pixel output POA according to the photo response signal DRA. The readout circuit RDB, coupled to the photodetector PDB, is configured to generate a pixel output POB according to the photo response signal DRB.

The readout circuit RDA of the pixel PXA is adjacent to the photodetector PDB of the pixel PXB along the first predetermined direction D1, and is adjacent to the photodetector PDA of the pixel PXA along a second predetermined direction D2 (e.g. a column direction) perpendicular to first the predetermined direction D1. For example, in the present embodiment, the photodetector PDA can be disposed at a side (e.g. an upper side) of the readout circuit RDA along the second predetermined direction D2, and the photodetector PDB can be disposed at another side (e.g. a lower side) of the readout circuit RDB opposite to the side along the second predetermined direction D2. In other words, the arrangement of the photodetector PDA and the readout circuit RDA in the pixel PXA and the arrangement of the photodetector PDB and the readout circuit RDB in the pixel PXB are inverted relative to each other. The pixel PXB may be regarded as an upside-down mirror image of the pixel PXA with respect to a pixel boundary BD. In this way, the readout circuit RDA/RDB may be immediately adjacent to a photosensitive area of a pixel in each of a row direction and a column direction.

In the present embodiment, a length of each pixel along the second predetermined direction D2 may be longer than a length of the pixel along the first predetermined direction D1. As a result, a photosensitive area of each pixel (corresponding to a photosensitive region of a photodetector) may increase, thereby increasing a fill factor and sensitivity of the pixel. By way of example but not limitation, a length L of each pixel may be twice a width W of the pixel. Compared with another pixel array, which has a same array area as the pixel array 122 and includes pixels each having a length of W and a width of W, the pixel array 122 may need only two readout circuits in a square-shaped area with side length L. However, the another pixel array would need four readout circuits which are located in four pixels respectively. As a result, when the pixel array 122 is read out at a read speed at which the another pixel array is read out, the proposed imaging scheme may have a higher frame rate.

It is worth noting that although the first predetermined direction D1 and the second predetermined direction D2 are a row direction and a column direction respectively in the above paragraphs, this is not intended to limit the scope of the present disclosure. In some embodiments, the first predetermined direction D1 and the second predetermined direction D2 may be a column direction and a row direction respectively.

Further, in some cases where the pixel array 122 is applied to a ToF imaging system, the readout circuit of each pixel may include two photoelectric readout units, which are controlled by control signals having different phases. As a result, a processing circuit in a next stage can obtain information about a phase shift between a transmitted signal and a received signal, such as signal information used for continuous-wave (CW) modulation or pulsed modulation.

In the present embodiment, the readout circuit RDA may include a first photoelectric readout unit 334 and a second photoelectric readout unit 336. The first photoelectric readout unit 334 is configured to be selectively coupled to the photodetector PDA according to a first control signal TX1, thereby generating a first portion of the pixel output POA of the pixel PXA. The second photoelectric readout unit 336 is configured to be selectively coupled to the photodetector PDA according to a second control signal TX2, thereby generating a second portion of the pixel output POA of the pixel PXA. The second control signal TX2 and the first control signal TX1 may have different phases. Similarly, the readout circuit RDB may include a first photoelectric readout unit 344 and a second photoelectric readout unit 346. The first photoelectric readout unit 344 is configured to be selectively coupled to the photodetector PDB according to the first control signal TX1, thereby generating a first portion of the pixel output POB of the pixel PXB. The second photoelectric readout unit 346 is configured to be selectively coupled to the photodetector PDB according to the second control signal TX2, thereby generating a second portion of the pixel output POB of the pixel PXB.

Figure 4:
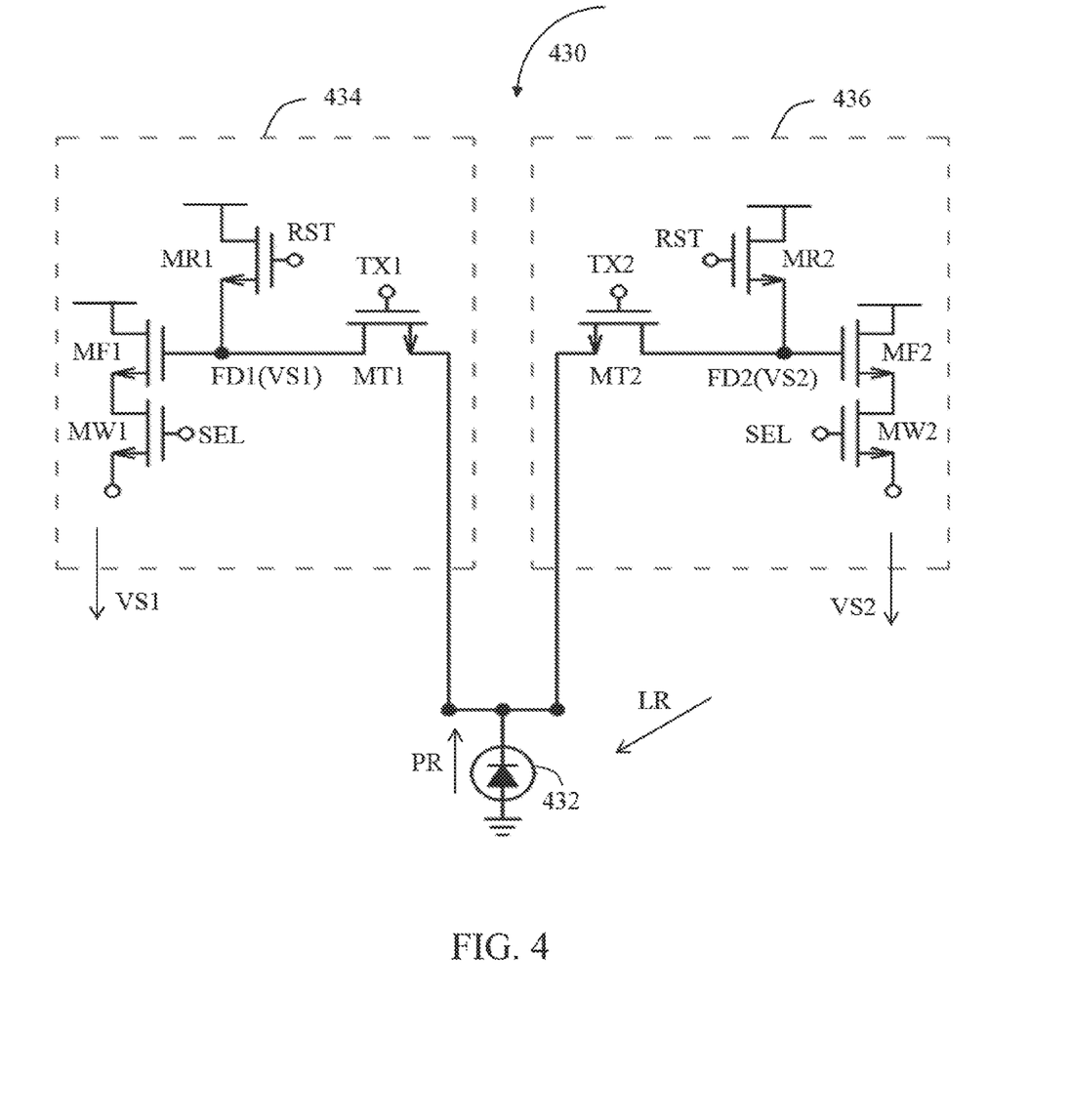
FIG. 4 is a diagram illustrating a circuit structure of each pixel of the pixel array shown in FIG. 3 used for a measurement scheme utilizing continuous-wave modulation in accordance with some embodiments of the present disclosure.
Figure 5:
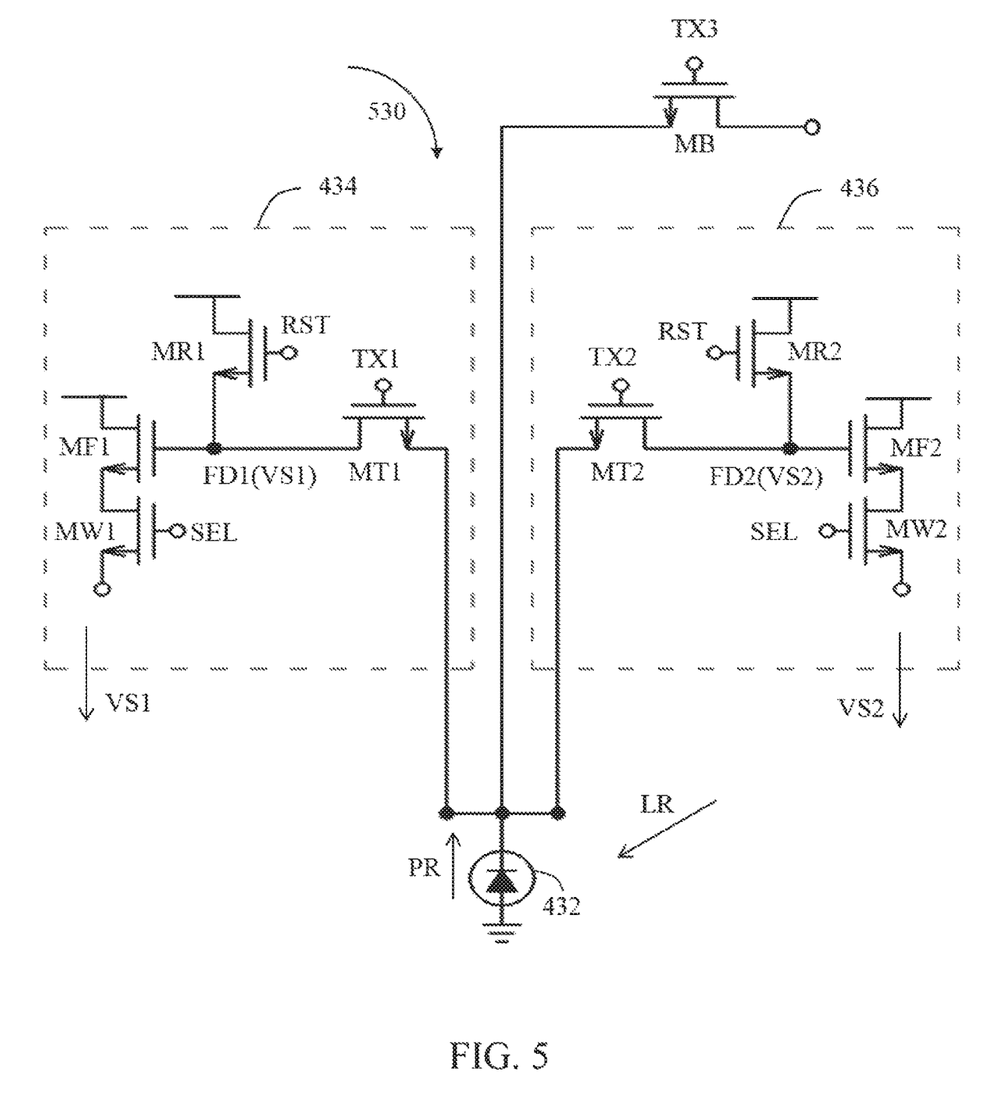
FIG. 5 is a diagram illustrating a circuit structure of each pixel of the pixel array shown in FIG. 3 used for a measurement scheme utilizing pulsed modulation in accordance with some embodiments of the present disclosure.

FIG. 4 and FIG. 5 illustrate respective readout circuit structures of pixels applied to depth information measurements of a target object, which are obtained using CW modulation and pulsed modulation respectively, in accordance with some embodiments of the present disclosure. However, the circuit structures shown in FIG. 4 and FIG. 5 are not intended to limit the scope of the present disclosure. Referring firstly to FIG. 4, a circuit structure of each pixel of the pixel array 122 shown in FIG. 3 used for a measurement scheme utilizing CW modulation is illustrated in accordance with some embodiments of the present disclosure. The pixel 430 may be used to implement the pixel PXA and the pixel PXB shown in FIG. 3. In the present embodiment, the pixel 430 includes, but is not limited to, a photodetector 432, a first photoelectric readout unit 434 and a second photoelectric readout unit 436. The photodetector PDA/PDB shown in FIG. 3 can be implemented using the photodetector 432, the first photoelectric readout unit 334/344 shown in FIG. 3 can be implemented using the first photoelectric readout unit 434, and/or the second photoelectric readout unit 336/346 shown in FIG. 3 can be implemented using the second photoelectric readout unit 436.

The photodetector 432, such as a photodiode, can detect the reflected signal LR and accordingly generate a photo response signal PR. The photo response signal PR can be outputted through at least one of the first photoelectric readout unit 434 and the second photoelectric readout unit 436. The photodetector 432 may convert a received optical signal to a corresponding photocurrent signal. In other words, the photo response signal PR may be a current signal indicative of a signal level of an optical signal. A photoelectric readout unit can be configured to read the photocurrent signal.

The first photoelectric readout unit 434 may include, but is not limited to, a first reset transistor MR1, a first transfer transistor MT1, a first output transistor MF1 and a first readout transistor MW1. The first reset transistor MR1 is configured to reset a first floating diffusion node FD1 according to a reset signal RST. The first transfer transistor MT1, coupled to the photodetector 432, is configured to be turned on according to the first control signal TX. In other words, the first transfer transistor MT1 is controlled by the first control signal TX1, thereby being connected to or disconnected from the photodetector 432. The first output transistor MF1 is configured to amplify a voltage signal at the first floating diffusion node FD, thereby generating a first amplified signal VS1. The first amplified signal VS1 can serve as a first portion of a pixel output of the pixel 430. Additionally, the first readout transistor MW1 is configured to selectively output the first amplified signal VS1 according to a select signal SEL.

The second photoelectric readout unit 436 is configured to be selectively coupled to the photodetector 432 according to a second control signal TX2, thereby generating a second portion of the pixel output of the pixel 430. The second control signal TX2 and the first control signal TX1 may have different phases. In the present embodiment, the second photoelectric readout unit 436 may include, but is not limited to, a second reset transistor MR2, a second transfer transistor MT2, a second output transistor MF2 and a second readout transistor MW2. The second reset transistor MR2 is configured to reset a second floating diffusion node FD2 according to the reset signal RST. The second transfer transistor MT2, coupled to the photodetector 432, is configured to be turned on according to the second control signal TX2. In other words, the second transfer transistor MT2 is controlled by the second control signal TX2, thereby being connected to or disconnected from the photodetector 432. The second output transistor MF2 is configured to amplify a voltage signal at the second floating diffusion node FD2, thereby generating a second amplified signal VS2. The second amplified signal VS2 can serve as a second portion of the pixel output of the pixel 430. Additionally, the second readout transistor MW2 is configured to selectively output the second amplified signal VS2 according to a select signal SEL.

As those skilled in the art should understand the operation of the first photoelectric readout unit 434 and the second photoelectric readout unit 436, which are configured to generate signal information used for CW modulation according to the first control signal TX1 and the second control signal TX2 respectively, further description is omitted here for brevity.

FIG. 5 is a diagram illustrating a circuit structure of each pixel of the pixel array 122 shown in FIG. 3 used for a measurement scheme utilizing pulsed modulation in accordance with some embodiments of the present disclosure. The pixel 530 may be used to implement the pixel PXA and the pixel PXB shown in FIG. 3. The difference between the circuit structure of the pixel 530 and the circuit structure of the pixel 430 shown in FIG. 4 is that the pixel 530 further includes an anti-blooming transistor MB. The anti-blooming transistor MB, controlled by a third control signal TX3, is configured to extract photoelectrons, which are generated from the photodetector 432 in response to reception of ambient light, to enhance ambient light immunity of the pixel 530. As those skilled in the art should understand the operation of the first photoelectric readout unit 434, the second photoelectric readout unit 436 and the anti-blooming transistor MB, which are configured to generate signal information used for pulsed modulation according to the first control signal TX1, the second control signal TX2 and the third control signal TX3 respectively, further description is omitted here for brevity.

Figure 6:
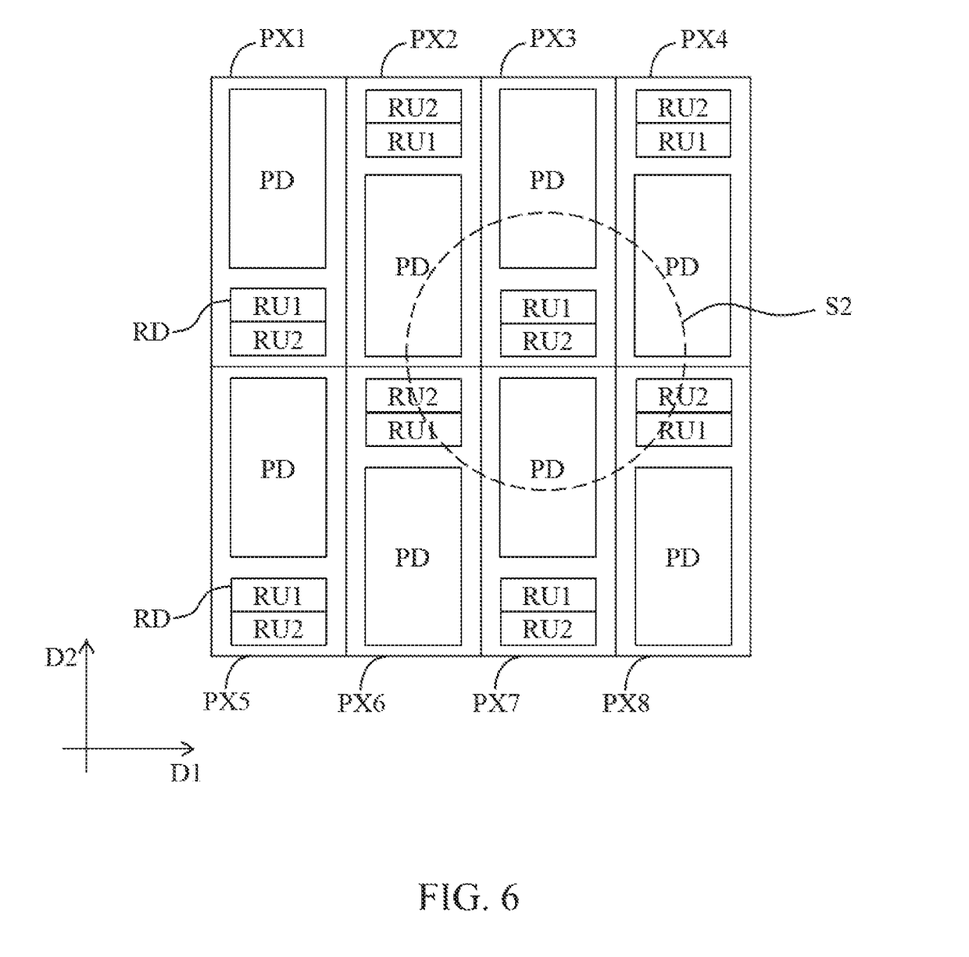
FIG. 6 is a diagram illustrating the reflected light spot shown in FIG. 3 located at a boundary of two adjacent pixels in accordance with some embodiments of the present disclosure.

Referring again to FIG. 3, each pixel of the pixel array 122 may be implemented using structures similar/identical to those of the pixel PXA and the pixel PXB. As a result, even if a center of a single reflected light spot S2 deviates from a photosensitive area of a single pixel, a photo response signal of sufficient intensity can be generated. Referring to FIG. 3 and FIG. 6, the reflected light spot S2 shown in FIG. 3 is located at a boundary of two adjacent pixels shown in FIG. 6 in accordance with some embodiments of the present disclosure. In the present embodiment, the photodetector of each pixel, i.e. each of the pixels PX1-PX8, is labeled PD for the sake of brevity. Also, the readout circuit of each pixel is labeled RD for the sake of brevity. Each readout circuit may include two photoelectric readout units RU1 and RU2, which can be implemented using the first photoelectric readout unit 334/344 and the second photoelectric readout unit 336/346 shown in FIG. 3, respectively.

For example, the readout circuit RD of the pixel PX3 is adjacent to the respective photodetectors PD of the pixel PX2 and the pixel PX7 besides the respective photodetectors PD of the pixel PX3 and the pixel PX4. Thus, even if a center of the reflected light spot S2 deviates from a photosensitive area of a single pixel, the pixel array 122 may provide a sufficient photosensitive area for detecting the reflected light spot S2 by arranging the respective photodetectors PD of a group of pixels disposed along the first predetermined D1 (e.g. a row of pixels) in a staggered manner in the second predetermined direction D2.

Figure 7:
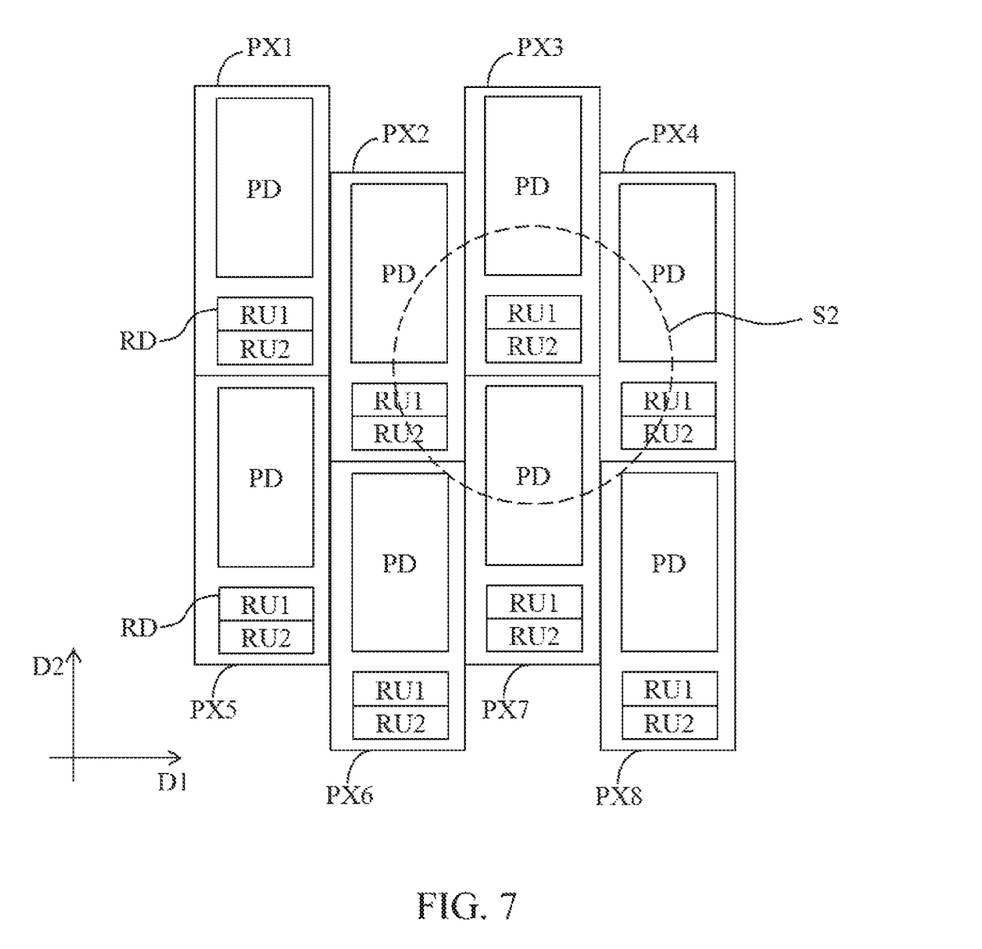
FIG. 7 is a diagram illustrating the reflected light spot shown in FIG. 3 located at a boundary of two adjacent pixels in accordance with some embodiments of the present disclosure.

FIG. 7 is a diagram illustrating the reflected light spot S2 shown in FIG. 3 located at a boundary of two adjacent pixels in accordance with some embodiments of the present disclosure. Each pixel of the pixel array shown in FIG. 3 may be implemented using the pixel architecture shown in FIG. 7. The difference between the pixel arrangement shown in FIG. 7 and the pixel arrangement shown in FIG. 6 is that the photodetector PD of each pixel shown in FIG. 7 is disposed at a same side (e.g. an upper side) of the readout circuit RD of the pixel in the predetermined direction D2. For example, the pixel PX2/PX4/PX6/PX8 may be implemented using an upside-down pixel relative to the pixel PXB shown in FIG. 3. In the present embodiment, a group of pixels disposed along the first predetermined D1 (e.g. a row of pixels) may be arranged in a staggered manner in the second predetermined direction D2, such that a readout circuit of a single pixel may be enclosed by four photodetectors. As a result, even if a center of the reflected light spot S2 deviates from a photosensitive area of a single pixel, the pixel array 122 may provide a sufficient photosensitive area for detecting the reflected light spot S2.

Figure 8:
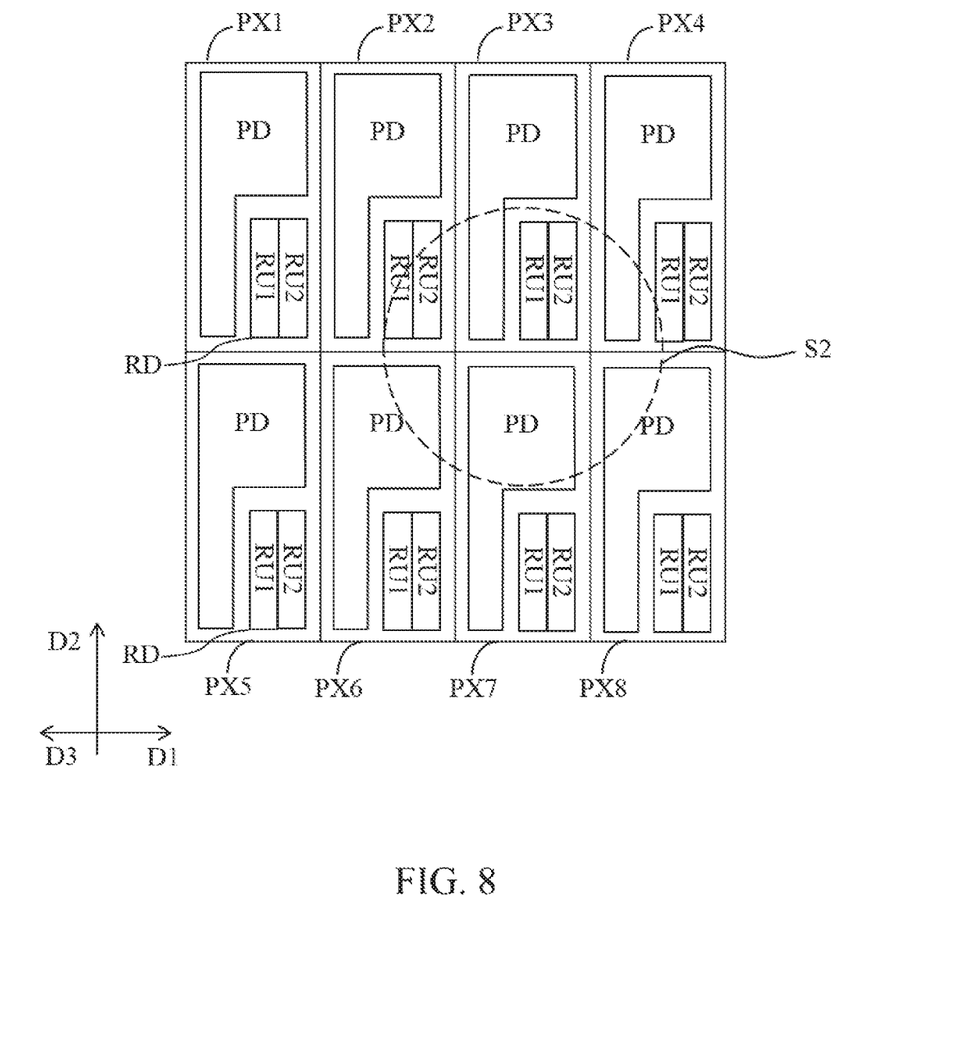
FIG. 8 is a diagram illustrating the reflected light spot shown in FIG. 3 located at a boundary of two adjacent pixels in accordance with some embodiments of the present disclosure.

FIG. 8 is a diagram illustrating the reflected light spot S2 shown in FIG. 3 located at a boundary of two adjacent pixels in accordance with some embodiments of the present disclosure. Each pixel of the pixel array shown in FIG. 3 may be implemented using the pixel architecture shown in FIG. 8. The difference between the pixel arrangement shown in FIG. 8 and the pixel arrangement shown in FIG. 6 is that a photosensitive area of the photodetector PD of each pixel shown in FIG. 8 is non-quadrilateral in shape. In the present embodiment, the photodetector PD of each pixel has an L-shaped photosensitive area, and the corresponding readout circuit RD may be disposed at an inside corner of the L-shaped photosensitive area. The periphery of the readout circuit RD can be enclosed by photosensitive areas. For example, the readout circuit RD of the pixel PX3 is adjacent to the photodetector PD of the pixel PX4 along the first predetermined direction D1, and is adjacent to the photodetector PD of the pixel PX3 along the second predetermined direction D2. Additionally, the readout circuit RD of the pixel PX3 is adjacent to the photodetector PD of the pixel PX3 along a third predetermined direction D3 opposite to the first predetermined direction D1. As a result, even if a center of the reflected light spot S2 deviates from a photosensitive area of a single pixel, the pixel array 122 may provide a sufficient photosensitive area for detecting the reflected light spot S2.

Figure 9:
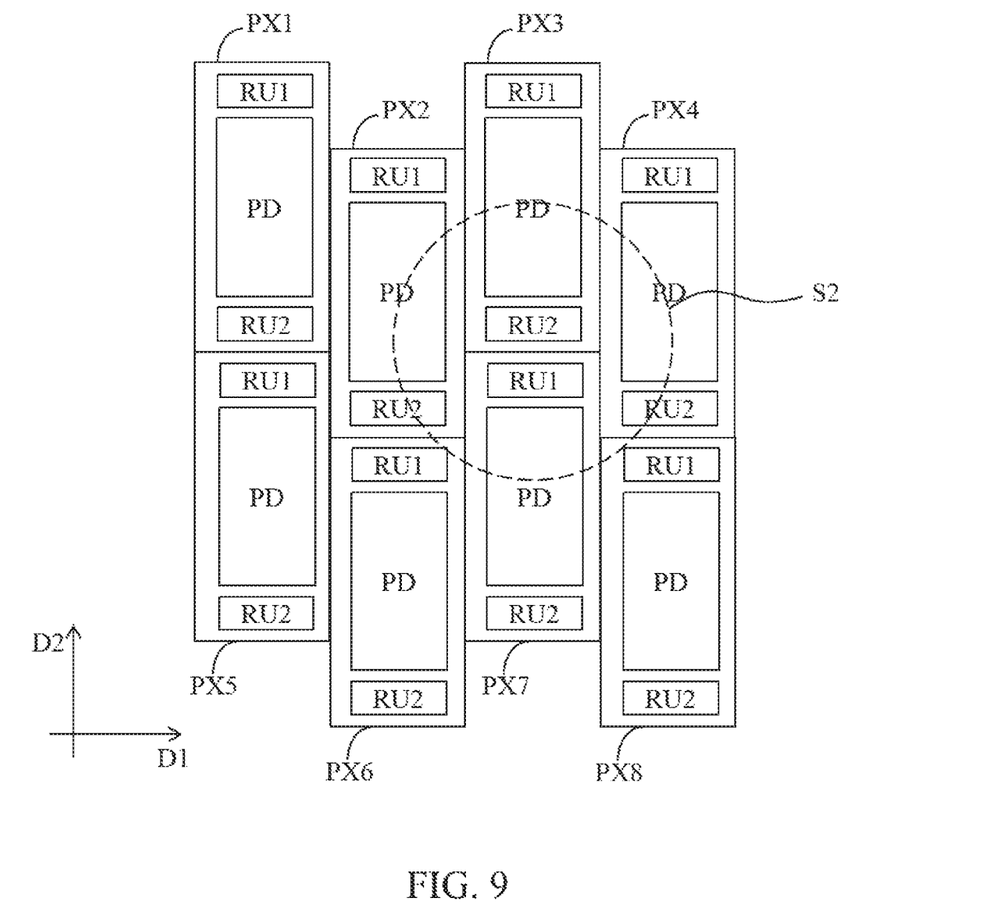
FIG. 9 is a diagram illustrating the reflected light spot shown in FIG. 3 located at a boundary of two adjacent pixels in accordance with some embodiments of the present disclosure.

Although the above paragraphs are described with reference to some embodiments where the first photoelectric readout unit and the second photoelectric readout unit of each pixel are disposed at a same side of the photodetector of the pixel, this is not intended to limit the scope of the present disclosure. FIG. 9 is a diagram illustrating the reflected light spot S2 shown in FIG. 3 located at a boundary of two adjacent pixels in accordance with some embodiments of the present disclosure. Each pixel of the pixel array shown in FIG. 3 may be implemented using the pixel architecture shown in FIG. 9. Compared with the pixel arrangement shown in FIG. 6 to FIG. 8, the first photoelectric readout unit RU1 and the second photoelectric readout unit RU2 of each pixel shown in FIG. 9 can be disposed at a side (e.g. an upper side) and another side opposite to the side (e.g. a lower side) of the photodetector PD of the pixel. As a group of pixels disposed along the first predetermined D1 (e.g. a row of pixels) can be arranged in a staggered manner in the second predetermined direction D2, a readout circuit located at a pixel boundary (e.g. the second photoelectric readout unit RU2 of the pixel PX3 and the first photoelectric readout unit RU1 of the pixel PX7) can be enclosed by sufficient photosensitive areas. As a result, even if a center of the reflected light spot S2 deviates from a photosensitive area of a single pixel, the pixel array 122 may provide a sufficient photosensitive area for detecting the reflected light spot S2.

Figure 10:
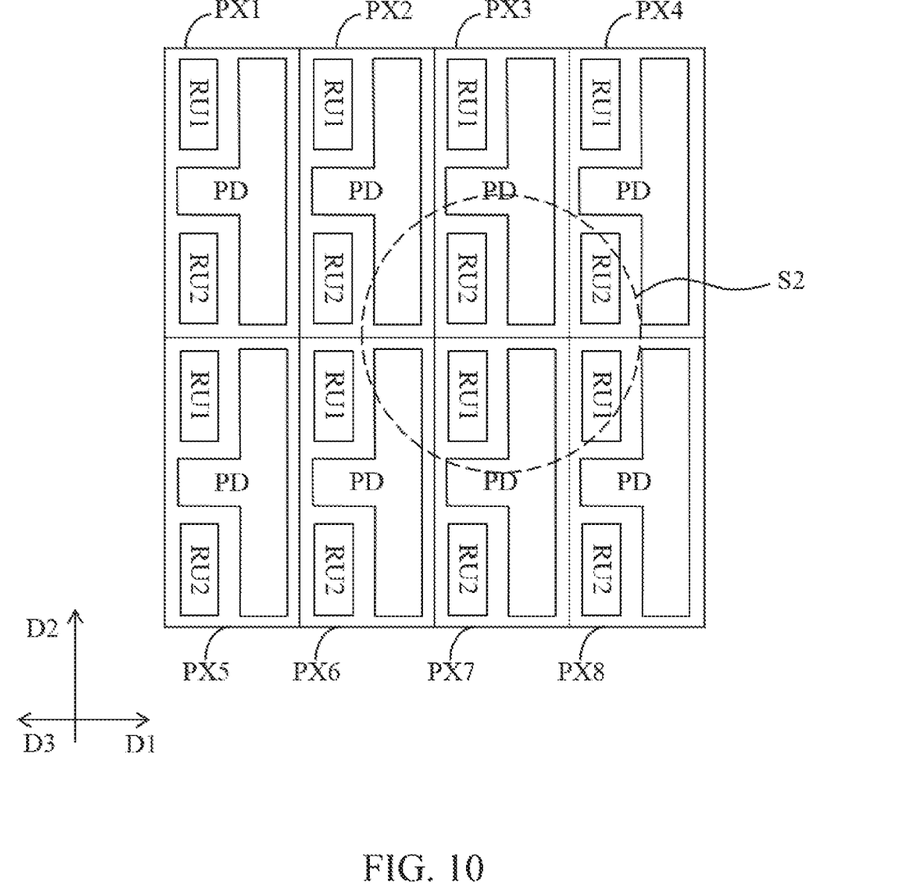
FIG. 10 is a diagram illustrating the reflected light spot shown in FIG. 3 located at a boundary of two adjacent pixels in accordance with some embodiments of the present disclosure.

FIG. 10 is a diagram illustrating the reflected light spot S2 shown in FIG. 3 located at a boundary of two adjacent pixels in accordance with some embodiments of the present disclosure. Each pixel of the pixel array shown in FIG. 3 may be implemented using the pixel architecture shown in FIG. 10. The difference between the pixel arrangement shown in FIG. 10 and the pixel arrangement shown in FIG. 6 is that a photosensitive area of the photodetector PD of each pixel shown in FIG. 10 is non-quadrilateral in shape. Also, the first photoelectric readout unit RU1 and the second photoelectric readout unit RU2 of each pixel can be disposed at different sides of the photodetector PD. In the present embodiment, the photodetector PD of each pixel has a T-shaped photosensitive area. The corresponding first photoelectric readout unit RU1 may be disposed at an inside corner of the T-shaped photosensitive area, and the corresponding second photoelectric readout unit RU2 may be disposed at another inside corner of the T-shaped photosensitive area. As a result, a readout circuit located at a pixel boundary (e.g. the second photoelectric readout unit RU2 of the pixel PX3 and the first photoelectric readout unit RU1 of the pixel PX7) can be enclosed by sufficient photosensitive areas. Even if a center of the reflected light spot S2 deviates from a photosensitive area of a single pixel, the pixel array 122 may provide a sufficient photosensitive area for detecting the reflected light spot S2.

It is worth noting that the pixel arrangements described above are provided for illustrative purposes, and are intended to limit the scope of the present disclosure. As long as a readout circuit of a pixel can be immediately adjacent to photosensitive areas of photodetectors in each of a row direction and a column direction, associated modifications and alternatives fall within the scope and spirit of the present disclosure.

By sensing a structured light signal having a predetermined pattern from a transmitter side, the proposed imaging scheme can make a reflected signal, reflected from a target object and returns to a receiver side, form a plurality of reflected light sports on a pixel array, thereby increasing signal intensity of an optical signal incident on pixels and reducing effects of background noise. In addition, the proposed imaging scheme may use an asymmetrical pixel arrangement, such as a pixel arrangement where each pixel is rectangular in shape, respective photosensitive areas of consecutive pixels are arranged in a staggered manner, and/or a photosensitive area is non-quadrilateral in shape. With the use of the asymmetrical pixel arrangement, the proposed imaging scheme may meet requirements for small pixel pitches and high fill factors, and have high sensitivity, high resolution and high frame rates.

While certain exemplary embodiments have been described and shown in the accompanying drawing, it is to be understood that such embodiments are merely illustrative of and not restrictive on the present disclosure. Those skilled in the art will readily observe that numerous modifications and alterations of the device and method may be made while retaining the teachings of the present disclosure. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
a pixel array comprising a plurality of pixels arranged in rows and columns, the pixels configured to sense a reflected signal, the reflected signal being incident on the pixel array to form a plurality of reflected light spots separated from each other on the pixel array, wherein each of the pixels comprises:
a photodetector, configured to detect the reflected signal and accordingly output a photo response signal; and
a readout circuit, coupled to the photodetector, the readout circuit being configured to transfer the photo response signal to a first floating diffusion node, and generate a pixel output at least according to a signal at the first floating diffusion node, wherein the readout circuit comprises a first transfer transistor configured to selectively couple the photo response signal to the first floating diffusion node;
wherein respective photodetectors of a group of pixels of the pixels disposed along a first predetermined direction are arranged in a staggered manner in the first predetermined direction; the group of pixels comprise a first pixel and a second pixel adjacent to the first pixel in the first predetermined direction; as viewed from top of the pixel array, a gate of the first transfer transistor in the readout circuit of the first pixel is spaced apart from a photosensitive area of the photodetector of the first pixel, and is spaced apart from a photosensitive area of the photodetector of the second pixel; as viewed from the top of the pixel array, each of the photodetector of the first pixel and the readout circuit of the first pixel is adjacent to and faces the photodetector of the second pixel, spaced apart from the readout circuit of the first pixel, along the first predetermined direction, and the readout circuit of the first pixel is adjacent to the photodetector of the first pixel along a second predetermined direction perpendicular to the first predetermined direction.

2. The image sensor of claim 1, wherein the photodetector of the first pixel is disposed at a side of the readout circuit of the first pixel along the second predetermined direction, and the photodetector of the second pixel is disposed at another side of the readout circuit of the second pixel opposite to the side along the second predetermined direction.

3. The image sensor of claim 1, wherein the group of pixels of the pixels disposed along the first predetermined direction are arranged in a staggered manner in the second predetermined direction.

4. The image sensor of claim 1, wherein the first predetermined direction is a row direction, and the second predetermined direction is a column direction.

5. The image sensor of claim 1, wherein as viewed from the top of the pixel array, a gate of the first transistor in the readout circuit of the second pixel is spaced apart from each of the readout circuit of the first pixel and the photosensitive area of the photodetector of the second pixel.

6. The image sensor of claim 1, wherein a length of at least one pixel in the first predetermined direction is shorter than a distance between two adjacent reflected light spots of the reflected light spots in the first predetermined direction.

7. The image sensor of claim 1, wherein a length of each pixel along the second predetermined direction is longer than a length of the pixel along the first predetermined direction.

8. The image sensor of claim 1, wherein the readout circuit of the first pixel comprises:
a first photoelectric readout unit, configured to be selectively coupled to the photodetector of the first pixel according to a first control signal, and generate a first portion of the pixel output of the first pixel, wherein the first transfer transistor is included in the first photoelectric readout unit, and controlled by the first control signal to selectively couple the photo response signal to the first floating diffusion node; and a second photoelectric readout unit, configured to be selectively coupled to the photodetector of the first pixel according to a second control signal, and generate a second portion of the pixel output of the first pixel, wherein the second control signal and the first control signal have different phases; a second transfer transistor included in the second photoelectric readout unit is controlled by the second control signal to selectively couple the photo response signal to a second floating diffusion node.

9. The image sensor of claim 8, wherein the first photoelectric readout unit and the second photoelectric readout unit are disposed at a same side of the photodetector of the first pixel.

10. The image sensor of claim 8, wherein the first photoelectric readout unit and the second photoelectric readout unit are disposed at opposite sides of the photodetector of the first pixel, respectively.

11. The image sensor of claim 1, wherein the reflected signal is reflected from a target object; the image sensor further comprises:

a processing circuit, coupled to the pixel array, the processing circuit being configured to detect time of flight of the reflected signal according to the pixel output, and obtain depth information about the target object according to the time of flight.

12. An imaging system, comprising:

a light emitting unit, configured to send a structured light signal; and at least one pixel array, wherein each pixel array comprises a plurality of pixels arranged in rows and columns, the pixels configured to sense a reflected signal, the reflected signal being incident on the pixel array by the structured light signal to form a plurality of reflected light spots separated from each other on the pixel array, wherein each of the pixels comprises:

a photodetector, configured to detect the reflected signal and accordingly output a photo response signal; and a readout circuit, coupled to the photodetector, the readout circuit being configured to transfer the photo response signal to a floating diffusion node, and generate a pixel output at least according to a signal at the floating diffusion node, wherein the readout circuit comprises a transfer transistor configured to selectively couple the photo response signal to the floating diffusion node;

wherein respective photodetectors of a group of pixels of the pixels disposed along a first predetermined direction are arranged in a staggered manner in the first predetermined direction; the group of pixels comprise a first pixel and a second pixel adjacent to the first pixel in the first predetermined direction; as viewed from top of the pixel array, a gate of the transfer transistor in the readout circuit of the first pixel is spaced apart from a photosensitive area of the photodetector of the first pixel, and is spaced apart from a photosensitive area of the photodetector of the second pixel; as viewed from the top of the pixel array, each of the photodetector of the first pixel and the readout circuit of the first pixel is adjacent to and faces the photodetector of the second pixel, spaced apart from the readout circuit of the first pixel, along the first predetermined direction, and the readout circuit of the first pixel is adjacent to the photodetector of the first pixel along a second predetermined direction perpendicular to the first predetermined direction.

13. The imaging system of claim 12, wherein the reflected signal is reflected from a target object in response to the structured light signal; the image sensor further comprises:

a processing circuit, coupled to the pixel array, the processing circuit being configured to detect time of flight of the structured light signal according to the pixel output of the pixel array, and obtain depth information about the target object according to the time of flight.

14. The imaging system of claim 12, wherein the reflected signal is reflected from a target object in response to the structured light signal; projection of the structured light signal onto a cross section plane between the light emitting unit and the target object forms a plurality of light spots separated from each other.

15. The imaging system of claim 12, wherein each reflected light spot illuminates at least one pixel.

16. The imaging system of claim 12, wherein the light emitting unit comprises:

a light source, arranged to output an optical signal; and an optical microstructure, arranged to change a travel path of the optical signal to generate the structured light signal.

* * * * *